United States Patent
Ding

(10) Patent No.: US 10,916,718 B2
(45) Date of Patent: Feb. 9, 2021

(54) FLEXIBLE ARRAY SUBSTRATE, METHOD FOR MANUFACTURING SAME, AND DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Ding Ding, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 20 days.

(21) Appl. No.: 16/497,990

(22) PCT Filed: Jul. 3, 2019

(86) PCT No.: PCT/CN2019/094537
§ 371 (c)(1),
(2) Date: Sep. 26, 2019

(87) PCT Pub. No.: WO2020/173031
PCT Pub. Date: Sep. 3, 2020

(65) Prior Publication Data
US 2020/0403169 A1 Dec. 24, 2020

(30) Foreign Application Priority Data
Feb. 28, 2019 (CN) .......................... 2019 1 0149401

(51) Int. Cl.
H01L 51/00 (2006.01)
H01L 51/56 (2006.01)
H01L 27/32 (2006.01)

(52) U.S. Cl.
CPC ...... H01L 51/0097 (2013.01); H01L 27/3246 (2013.01); H01L 51/56 (2013.01); *H01L 27/3262* (2013.01)

(58) Field of Classification Search
None
See application file for complete search history.

(56) References Cited

U.S. PATENT DOCUMENTS

2014/0254112 A1 9/2014 Okumoto et al.
2018/0047802 A1* 2/2018 Yoon .................. H01L 27/3262
(Continued)

FOREIGN PATENT DOCUMENTS

CN 106783917 A 5/2017
CN 207116427 U 3/2018
(Continued)

*Primary Examiner* — Joe E. Schoenholtz
(74) *Attorney, Agent, or Firm* — Mark M. Friedman

(57) ABSTRACT

A flexible array substrate, a method for manufacturing the same, and a display panel are provided. The flexible array substrate adopts a structure of a double-layer metal layer to enclose an organic layer in a bending area, which can improve bending stress of a metal trace during bending and reduce probability of fracture; and the metal trace adopting the double-layered design reduces abnormality of a circuit caused by breakage of the metal trace in the bending area and improves product quality.

13 Claims, 8 Drawing Sheets

(56) References Cited

U.S. PATENT DOCUMENTS

| | | | |
|---|---|---|---|
| 2018/0342707 A1* | 11/2018 | Lee | H01L 27/3279 |
| 2019/0041915 A1* | 2/2019 | Park | H01L 27/3262 |
| 2019/0148474 A1 | 5/2019 | Bu | |
| 2019/0156708 A1 | 5/2019 | Li et al. | |
| 2019/0341406 A1 | 11/2019 | Liu et al. | |
| 2020/0091272 A1 | 3/2020 | Qin et al. | |
| 2020/0373369 A1* | 11/2020 | Kang | H01L 27/3258 |

FOREIGN PATENT DOCUMENTS

| | | |
|---|---|---|
| CN | 107910336 A | 4/2018 |
| CN | 107994055 A | 5/2018 |
| CN | 108288637 A | 7/2018 |
| CN | 108831908 A | 11/2018 |
| CN | 109309111 A | 2/2019 |

\* cited by examiner

FLEXIBLE ARRAY SUBSTRATE, METHOD FOR MANUFACTURING SAME, AND DISPLAY PANEL

FIELD OF INVENTION

The present application relates to a field of display devices, and in particular, to a flexible array substrate, a method for manufacturing the same, and a display panel.

BACKGROUND OF INVENTION

As display screens become more widely used, widescreen technology has become an important technology item. At the same time, the technology of narrow bezels of display panels is becoming more and more important. Advanced electronic products, especially hand-held electronic products, are increasingly oriented toward narrow bezels. In order to increase a screen ratio of the electronic product, a non-display area on a display panel is compressed smaller and smaller. A method of compressing the non-display area can be used to set a special-shaped area on a surface of a display area, and set a device such as a front camera and an earpiece of mobile phone in the special-shaped area; or a portion of a plurality of functional layers of an array substrate disposed in the non-display area is bent to a back of the substrate to achieve a narrow design of bezels of the display panels.

Technical Problem

A disadvantage of the method of bending the non-display area in the array substrate to the back surface of the substrate is that conductive metal trace is liable to crack or even break when the bending is performed, thereby causing poor display and affecting product use performance. Therefore, it is a key technology to improve the damage resistance of bent metal when bending.

SUMMARY OF INVENTION

Technical Solution

The purpose of the present application is to provide a flexible array substrate, a method for manufacturing the same, and a display panel, which can improve bending stress of a metal trace during bending, reduce the probability of occurrence of fracture condition. Moreover, it can reduce abnormality of a circuit caused by breakage of the metal trace in a bending area and improve product quality.

In order to achieve the above object, the present application provides a flexible array substrate including a bending area and a non-bending area, wherein the bending area and the non-bending area are sequentially arranged in a first direction, and a functional layer extends from the bending area to the non-bending area, wherein in the bending area, the functional layer includes a hole; an organic layer is filled in the hole, a surface of the organic layer is provided with at least one groove, and the groove extends in the first direction; and at least one metal trace covers the at least one groove, the metal trace includes a bottom metal layer, a top metal layer, and an organic interlayer disposed between the bottom metal layer and the top metal layer, an edge of the bottom metal layer and an edge of the top metal layer encloses to enclose the organic interlayer.

In an embodiment, further including a flexible substrate extending from the bending area to the non-bending area, the functional layer that is disposed on the flexible substrate, wherein the hole passes through the functional layer and a surface of the flexible substrate is exposed, a length of the groove is same as a length of the bending area in the first direction, and the edge of the bottom metal layer protrudes from an edge of the groove and covers a portion of the organic layer.

In an embodiment, the edge of the bottom metal layer protrudes from an edge of the groove and covers a portion of the organic layer.

In an embodiment, an orthographic projection of the top metal layer is within a range of orthographic projection of the bottom metal layer in a direction perpendicular to the flexible array substrate.

In an embodiment, an orthographic projection of the top metal layer coincides with an orthographic projection of the bottom metal layer in a direction perpendicular to the flexible array substrate.

In an embodiment, a length of the groove is same as a length of the bending area in the first direction.

In an embodiment, further including a flexible substrate extending from the bending area to the non-bending area, wherein the functional layer is disposed on the flexible substrate.

In an embodiment, the hole passes through the functional layer and a surface of the flexible substrate is exposed.

In a preferred embodiment, the present application provides a flexible array substrate including a bending area and a non-bending area, wherein the bending area and the non-bending area are sequentially arranged in a first direction, and a functional layer extends from the bending area to the non-bending area, wherein in the bending area, the functional layer includes a hole; an organic layer is filled in the hole, a surface of the organic layer is provided with at least one groove, and the groove extends in the first direction; and at least one metal trace covers the at least one groove, the metal trace includes a bottom metal layer, a top metal layer, and an organic interlayer disposed between the bottom metal layer and the top metal layer, an edge of the bottom metal layer and an edge of the top metal layer encloses to enclose the organic interlayer, and the edge of the bottom metal layer protrudes from an edge of the groove and covers a portion of the organic layer.

The present application also provides a method of manufacturing the above flexible array substrate, including the following steps: providing a base layer, the base layer including a bending area and a non-bending area, wherein the bending area and the non-bending area are sequentially arranged in a first direction, the base layer is provided with a functional layer, the functional layer extends from the bending area to the non-bending area; forming a hole in the functional layer in the bending area and filling an organic layer in the hole; patterning the organic layer to form at least one groove on a surface of the organic layer, wherein the groove extends in the first direction; forming a patterned bottom metal layer, the bottom metal layer covering sidewalls of the groove; forming an organic interlayer on the bottom metal layer; and forming a top metal layer on the organic interlayer, wherein an edge of the bottom metal layer and an edge of the top metal layer encloses to enclose the organic interlayer, thereby forming at least one metal trace.

In an embodiment, the base layer further including a flexible substrate, wherein the flexible substrate extends from the bending area to the non-bending area, and the functional layer is disposed on the flexible substrate.

In an embodiment, in the step of forming the hole on the functional layer, the hole passes through the functional layer and a surface of the flexible substrate is exposed, and in the step of filling the organic layer in the hole, the organic layer covers an exposed surface of the flexible substrate.

According to another aspect of the present application, a display panel is provided. The display panel includes the above flexible array substrate and a light-emitting layer disposed on the flexible array substrate, the light-emitting layer including an organic planarization layer, wherein the organic planarization layer extends from the bending area to the non-bending area, and the organic planarization layer covers the functional layer, the metal trace, and the organic layer.

In an embodiment, the light-emitting layer further includes a pixel definition layer extending from the bending area to the non-bending area, the pixel defining layer covers the organic planarization layer in the bending area, and the pixel definition layer is patterned to form a plurality of light-emitting areas in the non-bending area.

Beneficial Effect

The present application has the beneficial effects that: in a bending area, a metal trace adopts a structure of enclosing an organic layer with a double-layer metal layer, which can improve bending stress of the metal trace during bending, and reduces the probability of occurrence of the fracture; and the metal trace adopting the double-layered design reduces abnormality of a circuit caused by breakage of the metal trace in the bending area and improves product quality.

DETAILED DESCRIPTION OF EMBODIMENTS

Figure 1:
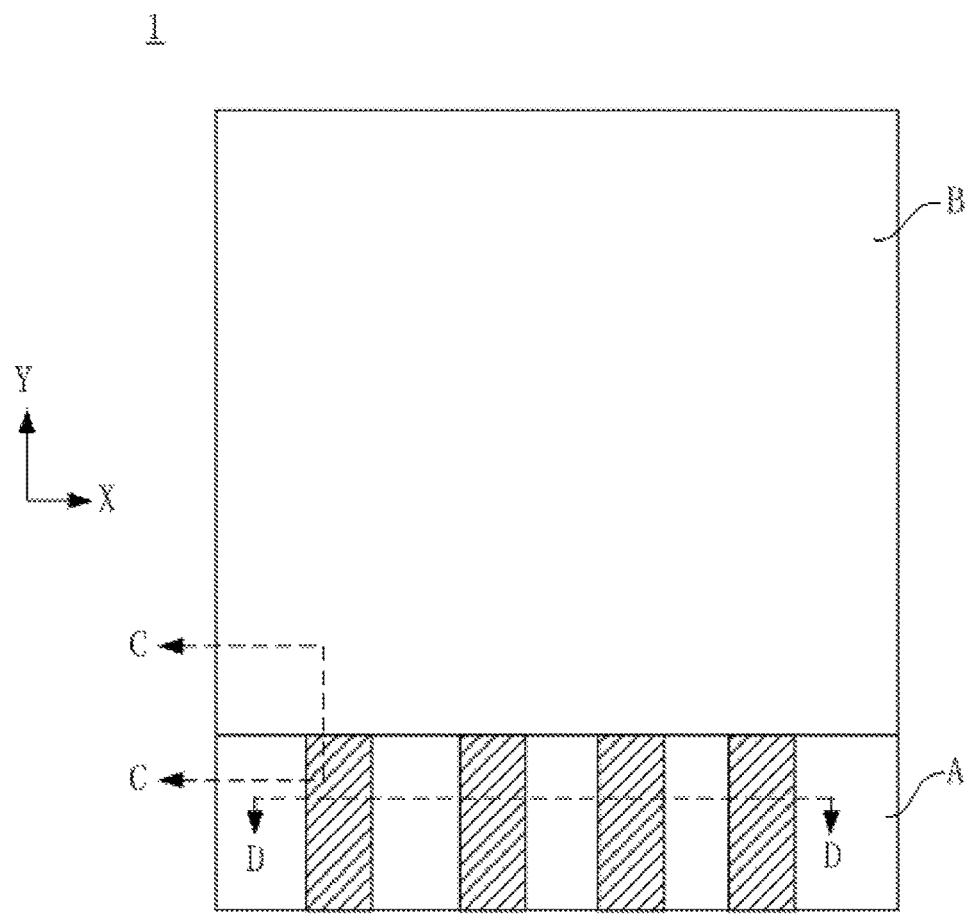
FIG. 1 is a schematic top view of a flexible array structure according to an embodiment of the application.

Hereinafter, technology of the present application will be described in detail in conjunction with specific embodiments. It should be understood that the following specific embodiments are only used to assist those skilled in the art to understand the present application and not to limit the application.

The following description of each embodiment, with reference to the accompanying drawings, is used to exemplify specific embodiments which may be carried out in the present invention. Directional terms mentioned in the present invention, such as, "up", "down", "front", "back", "left", "right", "side", "top", "bottom", etc., are only used with reference to the orientation of the accompanying drawings. Therefore, the used directional terms are intended to illustrate, but not to limit, the present invention. In the drawings, components having similar structures are denoted by the same numerals.

FIG. 1 is a schematic top view of a flexible array structure of the present application. Please refer to FIG. 1, the flexible array substrate 1 of the present application includes a bending area A and a non-bending area B. Wherein, the bending area A refers to an area that can bent relative to the non-bending area B. In a first direction, the bending area A and the non-bending area B are sequentially arranged. Specifically, in the present embodiment, in the Y direction, the bending area A and the non-bending area B are sequentially arranged. The non-bending area B can include a display area and a lead fan-out area as conventional areas, and the other side of the bending area A can further include a connection area connected to an integrated circuit, and those areas are all conventional structures in the art, and will not be described again.

Figure 2:
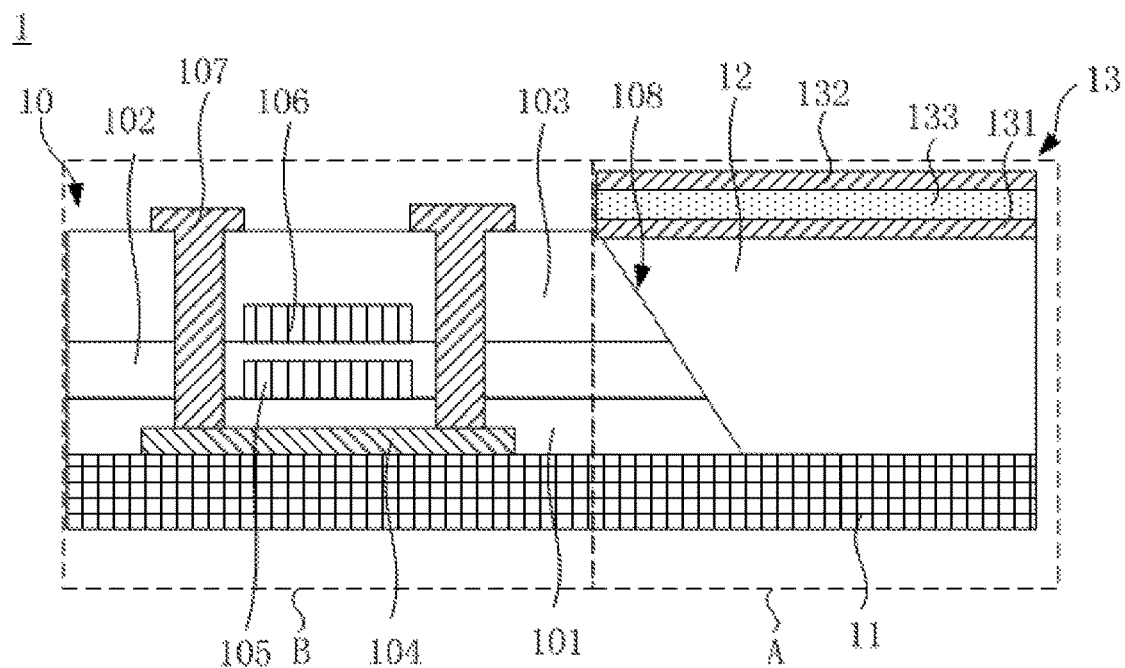
FIG. 2 is a schematic cross-sectional view of the flexible array substrate taken along line C-C of FIG. 1.
Figure 3:
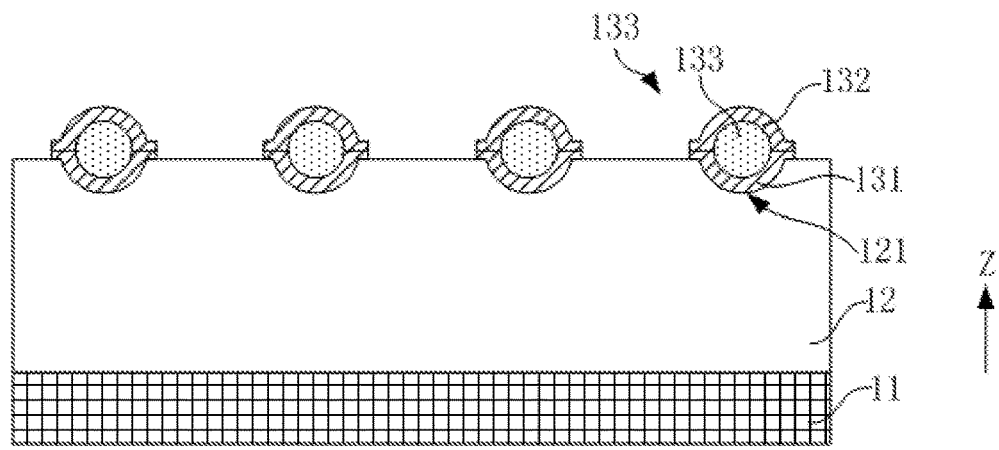
FIG. 3 is a schematic cross-sectional view of the flexible array substrate taken along line D-D of FIG. 1.

FIG. 2 is a schematic cross-sectional view of the flexible array substrate taken along line C-C of FIG. 1. FIG. 3 is a schematic cross-sectional view of the flexible array substrate taken along line C-C of FIG. 3. Please refer to FIG. 2 and FIG. 3, a functional layer 10 extends from the bending area A to the non-bending area B. Specifically, the functional layer 10 is also divided into the bending area A and the non-bending area B. In the present embodiment, the flexible array substrate 1 further includes a flexible substrate 11, the flexible substrate 11 extends from the bending area A to the non-bending area B, and the functional layer 10 is disposed on the flexible substrate 11. The flexible substrate 11 is a conventional flexible substrate including, but not limited to, one or several combinations selected from polyimide (PI), polyetherimide (PEI), polyphenylene sulfide (PPS), and polyarylester (PAR).

The functional layer 10 includes, but is not limited to, a thin film transistor layer, and structure of the thin film transistor layer is a conventional structure in the art. For example, in the present embodiment, the thin film transistor layer is a thin film transistor layer with a dual top gate structure. Specifically, the functional layer 10 includes a first gate insulating layer 101, a second gate insulating layer 102, and a passivation layer 103. The first gate insulating layer 101, the second gate insulating layer 102, and the passivation layer 103 extend from the bending area A to the non-bending area B.

In the non-bending area B, an active layer 104 is further disposed between the flexible substrate 11 and the first gate insulating layer 101, a first gate electrode 105 is disposed between the first gate insulating layer 101 and the second gate insulating layer 102, a second gate electrode 106 is disposed between the second gate insulating layer 102 and the passivation layer 103, and a source/drain electrode 107 is connected to the active layer 104 through the passivation layer 103, the second gate insulating layer 102, and the first gate insulating layer 101. Wherein, the first gate insulating layer 101, the active layer 104, the second gate insulating layer 102, the first gate electrode 105, the second gate electrode 106, and the passivation layer 103 form the thin film transistor layer. In other embodiments of the present application, the functional layer can also be a thin film transistor layer of another structure such as a thin film transistor layer of a single top gate structure, which is not limited in this application.

In the bending area A, the functional layer 10 includes a hole 108. Specifically, the hole 108 extends downward from an upper surface of the functional layer 10. The hole 108 can penetrate the functional layer 10 or cannot penetrate the functional layer 10. In the present embodiment, the hole 108 passes through the functional layer 10, specifically, the hole 108 passes through the passivation layer 103, the first gate insulating layer 101, and the second gate insulating layer 102, and a surface of the flexible substrate 11 is exposed.

Figure 4:
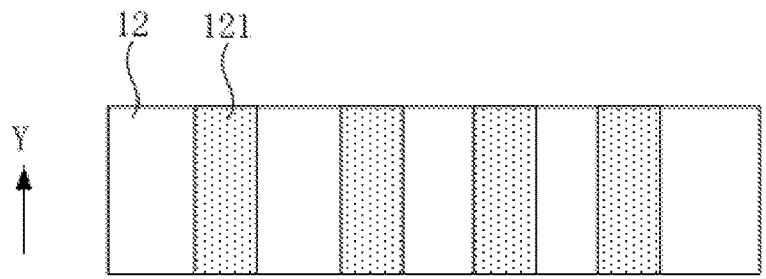
FIG. 4 is a schematic top view of an organic layer 12.

An organic layer 12 fills the hole 108. A surface of the organic layer 12 is provided with at least one groove 121. Specifically, a surface of the organic layer 12 away from the flexible substrate 11 is provided with at least one groove 121. FIG. 4 is a schematic top view of the organic layer 12. Referring to FIGS. 3 and 4, the groove 121 is recessed toward an interior of the organic layer 12. A number of the grooves 121 can be set according to actual needs, which is not limited in this application. Four grooves 121 are schematically illustrated in the figures. A plurality of grooves 121 are sequentially arranged in the X direction. The groove 121 extends in the first direction. Specifically, in the present embodiment, the groove 121 extends along the Y direction as shown in FIG. 4. The shape of the groove 121 can be selected according to actual use. For example, in the embodiment, the shape of the groove 121 is linear. Further, in the first direction, that is, in the Y direction, a length of the groove 121 is the same as a length of the bending area A.

Please refer to FIG. 2 and FIG. 3, the flexible array substrate further includes at least one metal trace 13, the metal trace 13 is configured to connect metal wires of the thin film transistor layer to an integrated circuit. The metal trace 13 covers at least one groove 121, and the metal trace 13 extends along the groove 121 in the first direction, for example, the Y direction. Specifically, the metal traces 13 are disposed in one-to-one correspondence with the grooves 121, that is, one of the metal traces 13 is disposed corresponding to one of the grooves 121. The metal trace 13 includes a bottom metal layer 131, a top metal layer 132, and an organic interlayer 133 between the bottom metal layer 131 and the top metal layer 132. An edge of the bottom metal layer 131 and an edge of the top metal layer 132 are enclosed to cover the organic interlayer 133. Specifically, in a direction perpendicular to the flexible array substrate, for example, the Z direction (perpendicular to the Y direction and the X direction), the bottom metal layer 131, the organic interlayer 133, and the top metal layer 132 are sequentially disposed, and the edge of the bottom metal layer 131 is enclosed with the edge of the top metal layer 132, and the organic interlayer 133 is wrapped in a space enclosed by the bottom metal layer 131 and the top metal layer 132.

In the bending area A, the metal trace 13 of the flexible array substrate of the present application adopts a structure of a double-layer metal layer to enclose the organic layer, which can improve bending stress of the metal trace during bending and reduce the probability of a fracture. The metal trace adopting the double-layered design reduces abnormality of a circuit caused by a breakage of the metal trace in the bending area and improves product quality.

Optionally, in the present embodiment, an edge of the bottom metal layer 131 protrudes from an edge of the groove 121 and covers a portion of the organic layer 12. Specifically, in a direction perpendicular to the flexible array substrate 1, an orthographic projection of the bottom metal layer 131 covers an orthographic projection of the groove 121, and an area of the orthographic projection of the bottom metal layer 131 is greater than an area of the orthographic projection of the groove 121. Wherein, at a position corresponding to the groove 121, the bottom metal layer 131 has the same shape as an inner wall of the groove 121, for example, a shape of the inner wall of the groove 121 is curve, then a shape of the bottom metal layer 131 is also curve.

Optionally, in the direction perpendicular to the flexible array substrate 1, the orthographic projection of the top metal layer 132 is within a range of the orthographic projection of the bottom metal layer 131. Specifically, in the direction perpendicular to the flexible array substrate 1, for example, the Z direction, the orthographic projection of the top metal layer 132 coincides with the orthographic projection of the bottom metal layer 131, or the orthographic projection of the bottom metal layer 131 covers the orthographic projection of the top metal layer 132. In the present embodiment, in the Z direction, the orthographic projection of the top metal layer 132 coincides with the orthographic projection of the bottom metal layer 131, that is, the area of the orthographic projection of the bottom metal layer 131 is equal to the area of the orthographic projection of the groove 121.

The present application also provides a method of manufacturing the above flexible array substrate. FIGS. 5A to 5L are diagrams showing a flowchart of a method for manufacturing a flexible array substrate according to an embodiment of the present application. The manufacturing method includes the following steps.

Figure 5A:
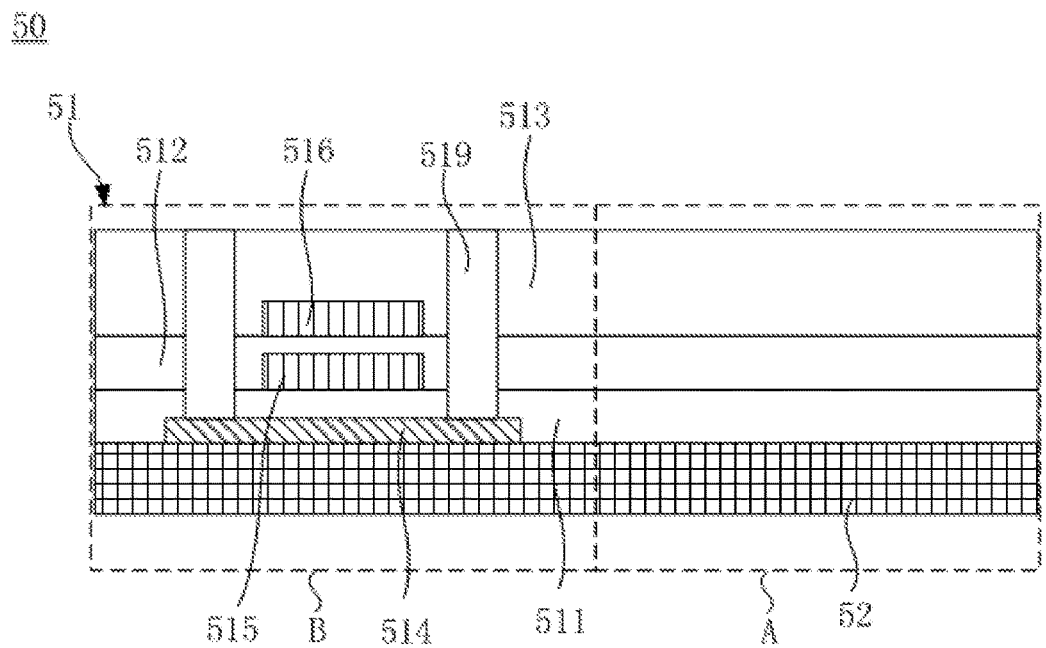
FIG. 5A to FIG. 5L are diagrams showing a flowchart of a method for manufacturing a flexible array substrate according to an embodiment of the present application.
Figure 5B:
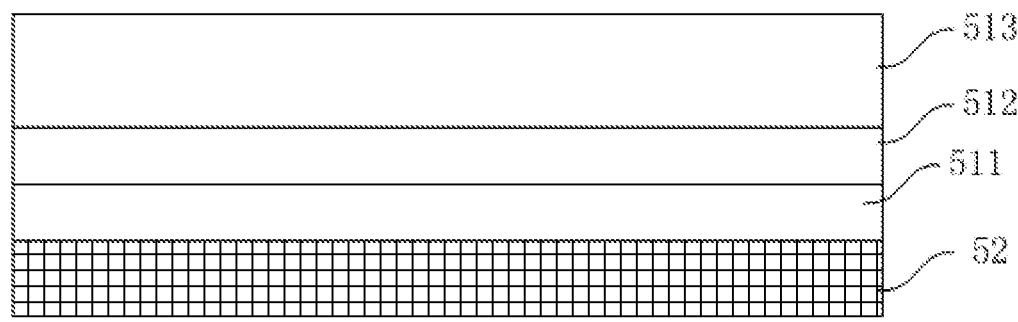

Referring to FIG. 5A and FIG. 5B, FIG. 5A is a schematic cross-sectional view taken along line C-C of FIG. 1, and FIG. 5B is a schematic cross-sectional view taken along line D-D of FIG. 1. A base layer 50 is provided. The base layer 50 includes a bending area A and a non-bending area B. In a first direction, such as the Y direction, the bending area A and the non-bending area B are sequentially arranged. The base layer 50 is provided with a functional layer 51, the functional layer 51 extends from the bending area A to the non-bending area B. The base layer 50 further includes a flexible substrate 52, the flexible substrate 52 extends from the bending area A to the non-bending area B, and the functional layer 51 is disposed on the flexible substrate 52.

In the present embodiment, the functional layer 51 is a thin film transistor layer. Specifically, the functional layer 51 includes a first gate insulating layer 511, a second gate insulating layer 512, and a passivation layer 513. The first gate insulating layer 511, the second gate insulating layer 512, and the passivation layer 513 extend from the bending area A to the non-bending area B. In the non-bending area B, an active layer 514 is further disposed between the flexible substrate 52 and the first gate insulating layer 511, a first gate electrode 515 is disposed between the first gate insulating layer 511 and the second gate insulating layer 512, and a second gate electrode 516 is disposed between the second gate insulating layer 512 and the passivation layer 513. A source/drain via 519 extends to the active layer 514. The method of forming the respective structures of the functional layer 51 is a conventional method in the art and will not be described again.

Figure 5C:
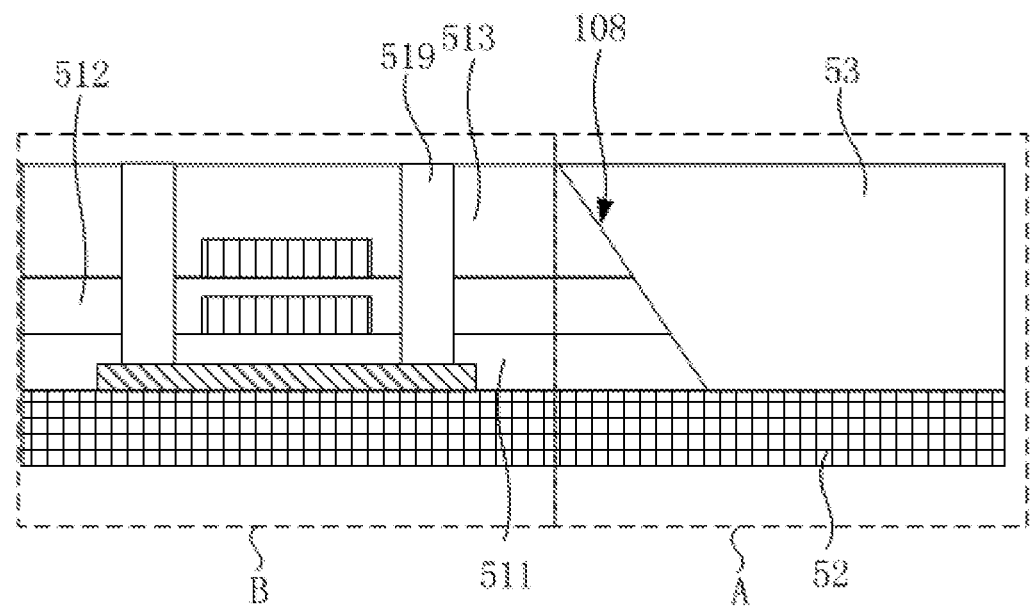
Figure 5D:
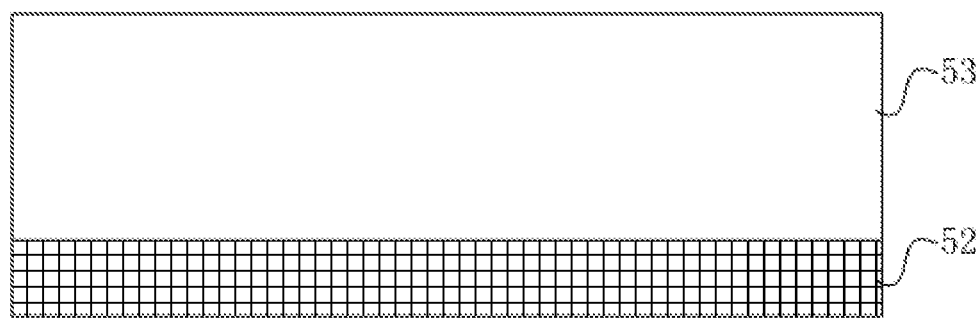

Referring to FIG. 5C and FIG. 5D, where FIG. 5C is a schematic cross-sectional view of the flexible array substrate taken along line C-C of FIG. 1, FIG. 5D is a schematic cross-sectional view of the flexible array substrate taken along line D-D of FIG. 1. In the bending area A, a hole 518 is formed in the functional layer 51, and an organic layer 53 fills the hole 518. The hole 518 can be formed by etching or the like. The hole 518 can be formed by using the same photomask as the source/drain via 519. In the present embodiment, the hole 518 passes through the functional layer 51. Specifically, the hole 518 passes through the passivation layer 513, the first gate insulating layer 511, and the second gate insulating layer 512, and a surface of the flexible substrate 52 is exposed.

Figure 5E:
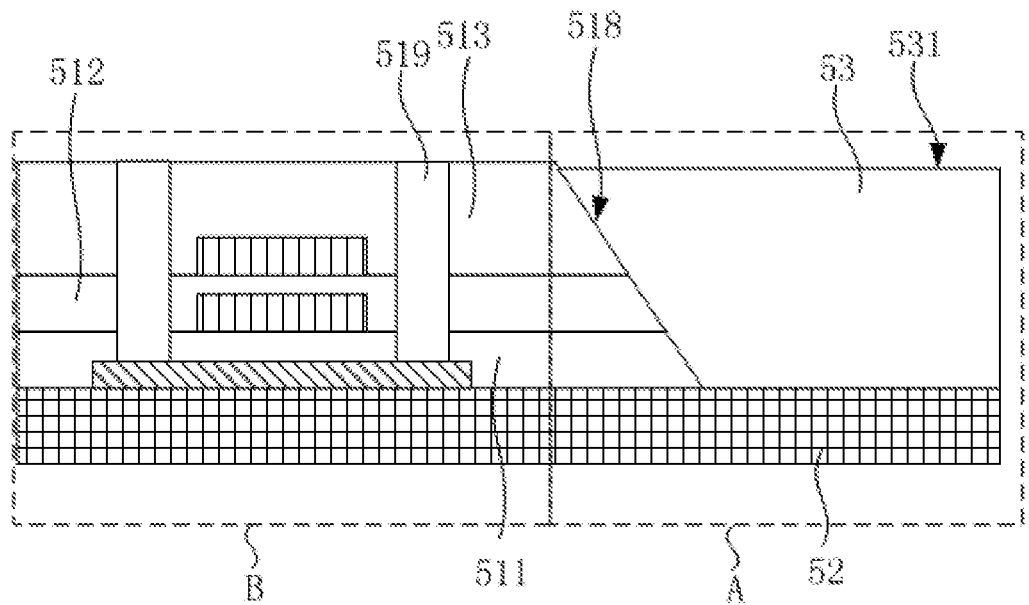
Figure 5F:
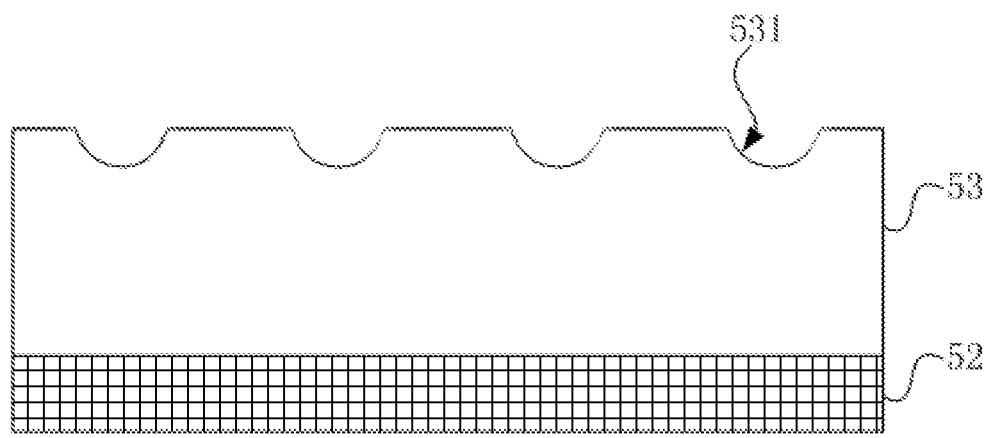

Referring to FIG. 5E and FIG. 5F, where FIG. 5E is a schematic cross-sectional view of the flexible array substrate taken along line C-C of FIG. 1, FIG. 5F is a schematic cross-sectional view of the flexible array substrate taken along line D-D of FIG. 1. The organic layer 53 is patterned to form at least one groove 531 on a surface of the organic layer 53, and the groove 531 extends in the first direction. As shown in FIG. 5F, four grooves 531 are schematically illustrated. Wherein, the groove 531 can be formed by a conventional method such as a mask method.

Figure 5G:
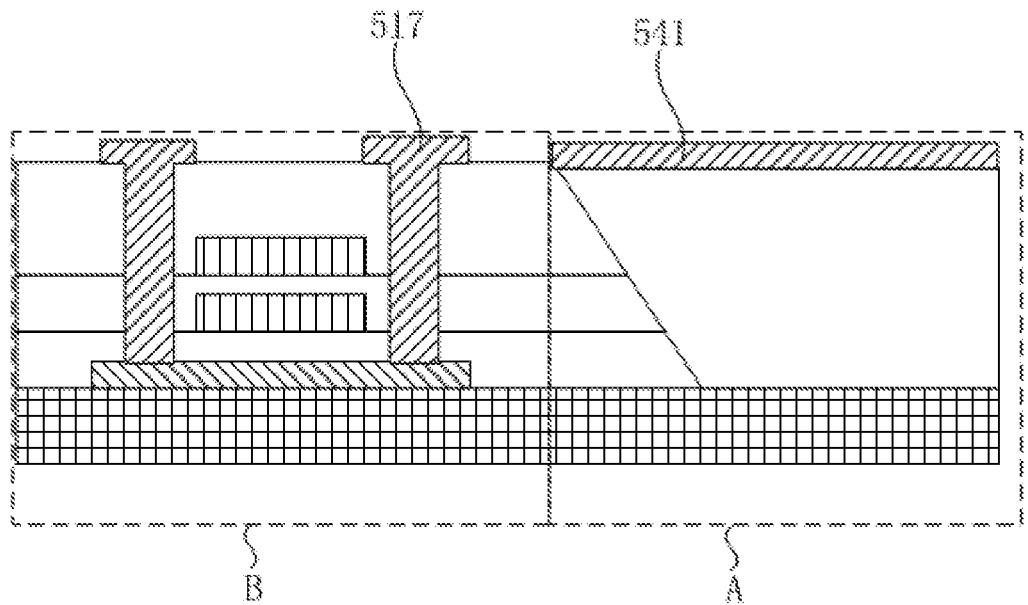
Figure 5H:
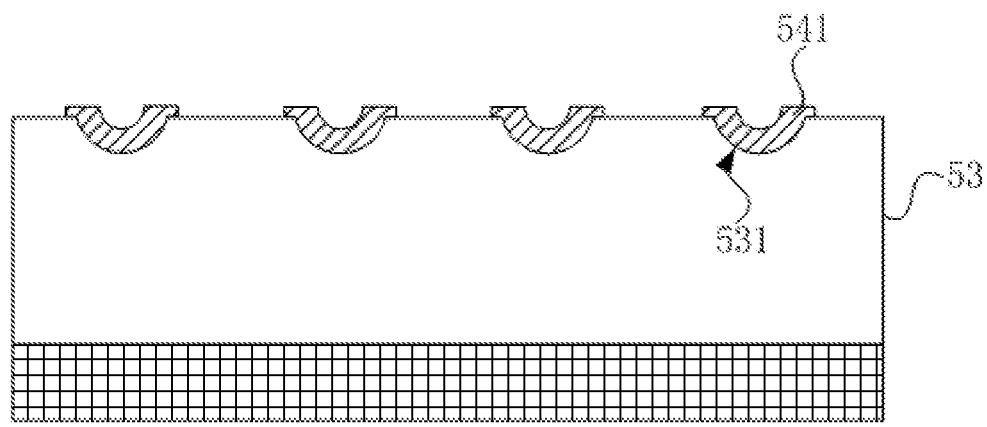

Referring to FIG. 5G and FIG. 5H, where FIG. 5G is a schematic cross-sectional view of the flexible array substrate taken along line C-C of FIG. 1, FIG. 5H is a schematic cross-sectional view of the flexible array substrate taken along line D-D of FIG. 1. A patterned bottom metal layer 541 is formed, the bottom metal layer 541 covers sidewalls of the groove 531. Specifically, in the present embodiment, a metal layer is deposited on the bending area A and the non-bending area B, and the metal layer is patterned. In the bending area, the metal layer is patterned to form the bottom metal layer 541, the bottom metal layer 541 is disposed corresponding to the groove 531, and an edge of the bottom metal layer 541 protrudes from an edge of the groove 531 and covers a portion of the organic layer 53. Specifically, in the direction perpendicular to the base layer 50, an orthographic projection of the bottom metal layer 541 covers an orthographic projection of the groove 531, and an area of the orthographic projection of the bottom metal layer 541 is greater than an area of the orthographic projection of the groove 531. Wherein, at a position corresponding to the groove 531, the shape of the bottom metal layer 541 is same as the shape of an inner wall of the groove 531, for example, the shape of the inner wall of the groove 531 is curve, then the shape of the bottom metal layer 541 is also curve. In the non-bending area B, source/drain electrodes 517 are formed after the metal layer is patterned.

Figure 5I:
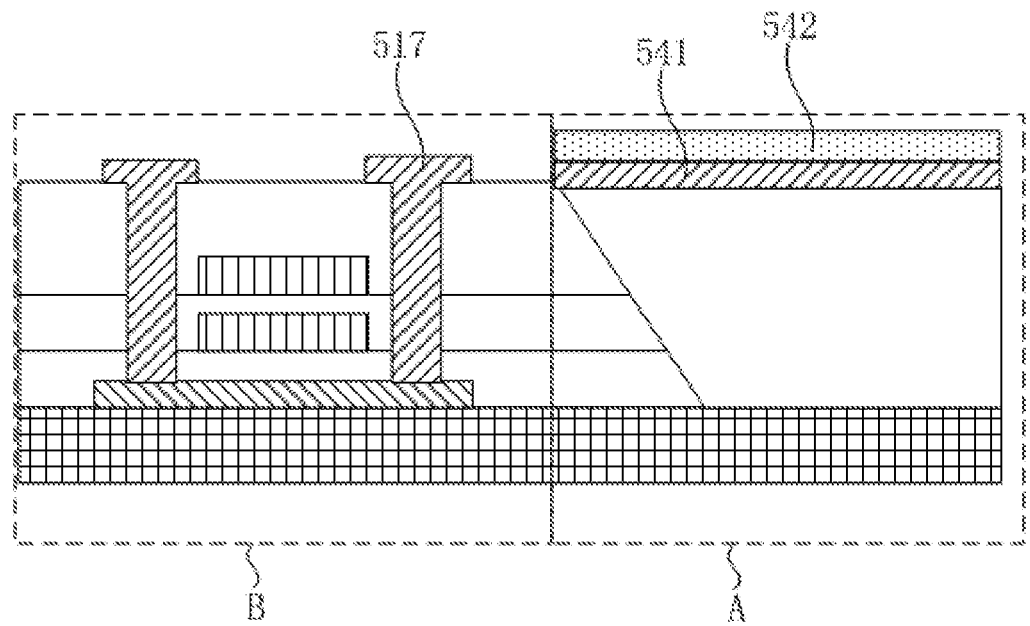
Figure 5J:
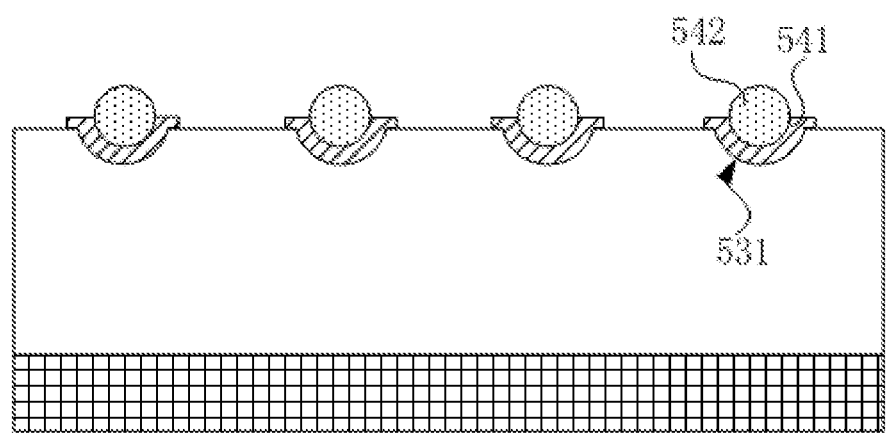

Referring to FIG. 5I and FIG. 5J, where FIG. 5I is a schematic cross-sectional view of the flexible array substrate taken along line C-C of FIG. 1, FIG. 5J is a schematic cross-sectional view of the flexible array substrate taken along line D-D of FIG. 1. An organic interlayer 542 is formed on the bottom metal layer 541. Specifically, an organic cover layer is deposited, the organic cover layer is patterned, and only the organic cover layer on the bottom metal layer 541 corresponding to the groove 531 is retained, and the retained organic cover layer is the organic interlayer 542.

Figure 5K:
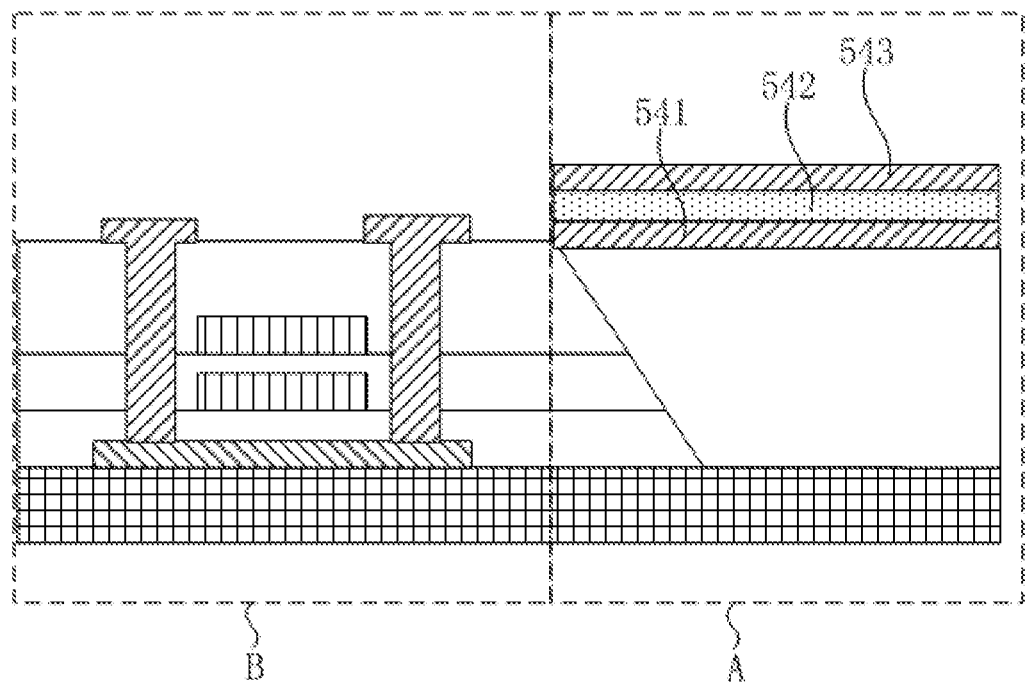
Figure 5L:
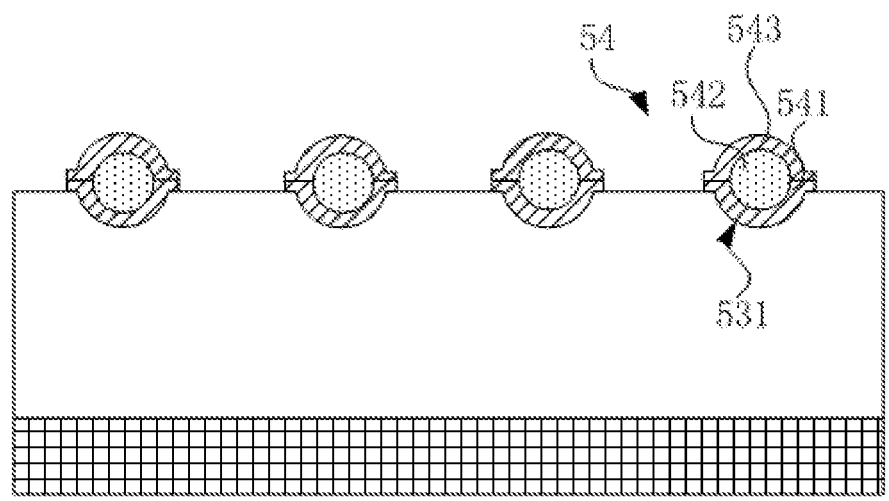

Referring to FIG. 5K and FIG. 5L, where FIG. 5K is a schematic cross-sectional view of the flexible array substrate taken along line C-C of FIG. 1, FIG. 5L is a schematic cross-sectional view of the flexible array substrate taken along line D-D of FIG. 1. A top metal layer 543 is formed on the organic interlayer 542. An edge of the bottom metal layer 541 and an edge of the top metal layer 543 are enclosed to cover the organic interlayer 542 to form at least one metal trace 54. Specifically, in the present embodiment, depositing a metal layer and patterning the metal layer, the top metal layer 543 of the non-bending area can be removed or retained. If the top metal layer 543 of the non-bending area is retained, a pattern of the top metal layer 543 can be consistent with and overlapped with a pattern of the bottom metal layer 541. In the bending area, only the metal layer corresponding to the bottom metal layer 541 of the bending area A is retained, and the retained metal layer serves as the top metal layer 543.

The specific manufacturing methods of respective layers involved in the present application are conventional methods in the art and will not be described again.

Figure 6A:
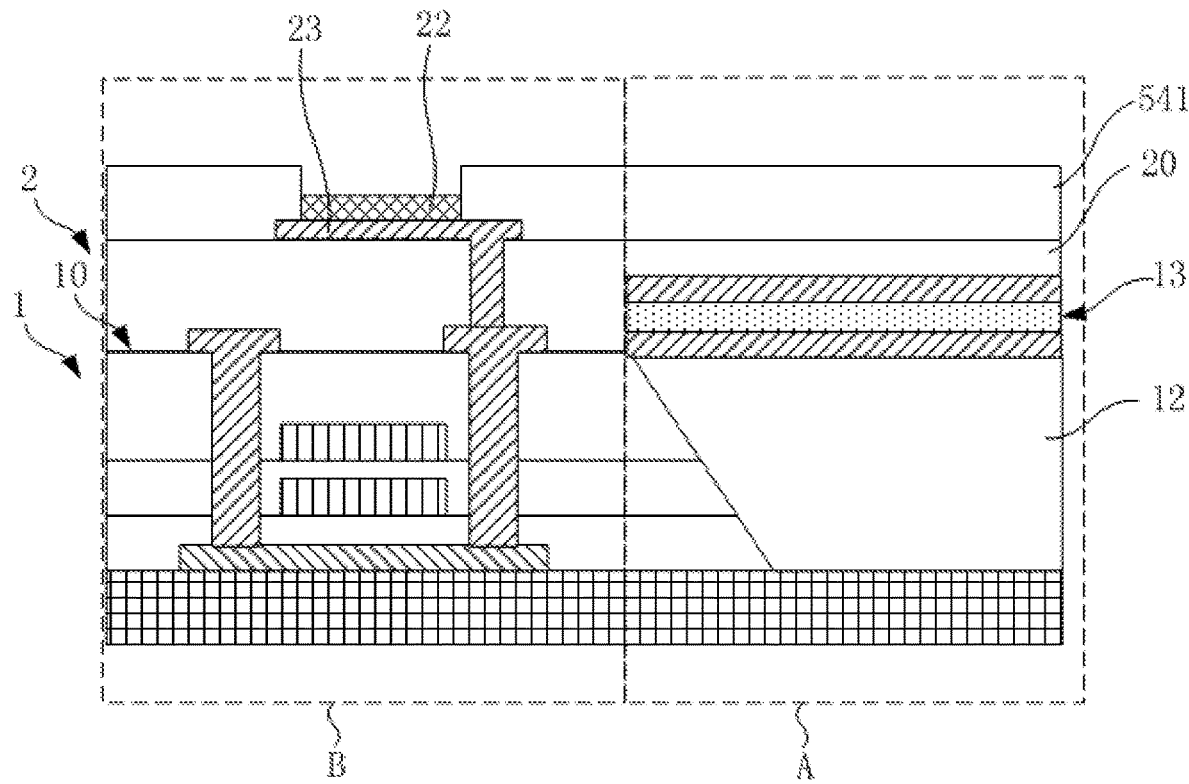
FIG. 6A is a schematic structural view in a direction of a display panel according to an embodiment of the present application.
Figure 6B:
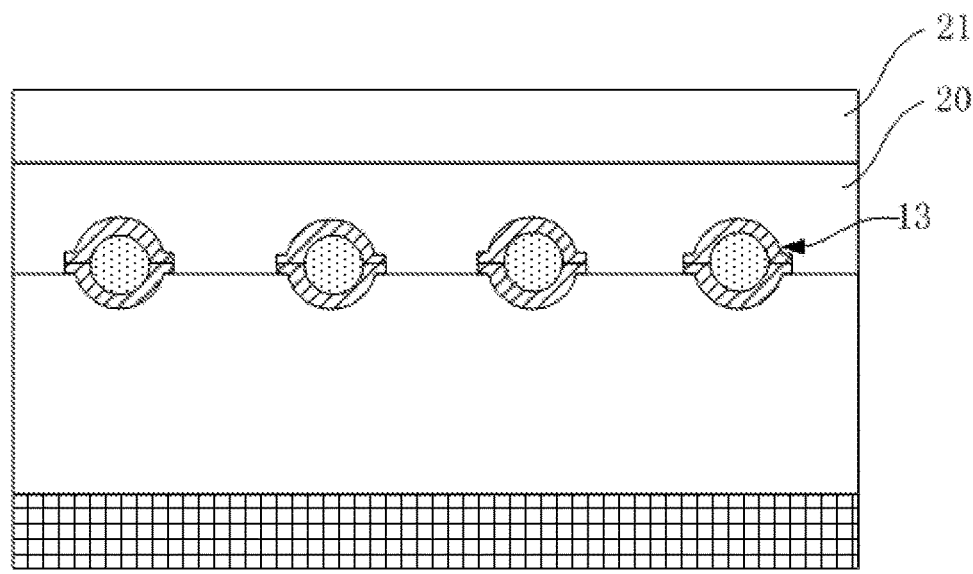
FIG. 6B is a schematic structural view in another direction of a display panel according to an embodiment of the present application.

The application further provides a display panel. FIG. 6A is a schematic structural view in a direction of the display panel, FIG. 6B is a schematic structural view in another direction of the panel display. Specifically, FIG. 6A is a schematic structural view taken along line C-C of FIG. 1, and FIG. 6B is a schematic structural view taken along line D-D of FIG. 1. Referring to FIGS. 6A and 6B, the display panel includes the flexible array substrate 1 as described above and a light-emitting layer 2 disposed on the flexible array substrate 1. The light-emitting layer 2 includes an organic planarization layer 20, the organic planarization layer 20 extends from the bending area A to the non-bending area B, and the planarization layer 20 covers the functional layer 10, the metal trace 13, and the organic layer 12. Further, the light-emitting layer 2 further includes a pixel definition layer 21, the pixel defining layer 21 extends from the bending area A to the non-bending area B. In the bending area A, the pixel definition layer 21 covers the organic planarization layer 20. In the non-bending area B, the pixel definition layer 21 is patterned to form a plurality of light-emitting areas. A plurality of light-emitting units 22 are disposed in the light-emitting areas respectively, and each of the light-emitting units 22 is connected to the source/drain of the functional layer 10 through an anode 23. In the present embodiment, the display panel is an organic light-emitting diode (OLED) display panel, and each structure of the light-emitting layer 2 is a conventional structure, and details are not described herein again.

Embodiments of the present invention have been described, but not intending to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

INDUSTRIAL APPLICABILITY

The subject matter of the present application can be manufactured and used in the industry with industrial applicability.

What is claimed is:

1. A flexible array substrate, comprising a bending area and a non-bending area, wherein the bending area and the non-bending area are sequentially arranged in a first direction, and a functional layer extends from the bending area to the non-bending area, wherein in the bending area, wherein,
    the functional layer comprises a hole;
    an organic layer fills the hole, a surface of the organic layer is provided with at least one groove, and the groove extends in the first direction; and
    at least one metal trace covers the at least one groove, the metal trace comprises a bottom metal layer, a top metal layer, and an organic interlayer disposed between the bottom metal layer and the top metal layer, an edge of the bottom metal layer and an edge of the top metal layer enclose to enclose the organic interlayer.

2. The flexible array substrate according to claim 1, further comprising a flexible substrate extending from the bending area to the non-bending area, the functional layer that is disposed on the flexible substrate, wherein the hole passes through the functional layer and a surface of the flexible substrate is exposed, a length of the groove is same as a length of the bending area in the first direction, and the edge of the bottom metal layer protrudes from an edge of the groove and covers a portion of the organic layer.

3. The flexible array substrate according to claim 1, wherein the edge of the bottom metal layer protrudes from an edge of the groove and covers a portion of the organic layer.

4. The flexible array substrate according to claim 1, wherein an orthographic projection of the top metal layer is within a range of an orthographic projection of the bottom metal layer in a direction perpendicular to the flexible array substrate.

5. The flexible array substrate according to claim 1, wherein an orthographic projection of the top metal layer coincides with an orthographic projection of the bottom metal layer in a direction perpendicular to the flexible array substrate.

6. The flexible array substrate according to claim 1, wherein a length of the groove is same as a length of the bending area in the first direction.

7. The flexible array substrate according to claim 1, further comprising a flexible substrate extending from the bending area to the non-bending area, wherein the functional layer is disposed on the flexible substrate.

8. The flexible array substrate according to claim 6, wherein, the hole passes through the functional layer and a surface of the flexible substrate is exposed.

9. A method of manufacturing the flexible array substrate of claim 1, comprising the steps of:
   providing a base layer, the base layer comprising a bending area and a non-bending area, wherein the bending area and the non-bending area are sequentially arranged in a first direction, the base layer is provided with a functional layer, the functional layer extends from the bending area to the non-bending area;
   forming a hole in the functional layer in the bending area and filling an organic layer in the hole;
   patterning the organic layer to form at least one groove on a surface of the organic layer, wherein the groove extends in the first direction;
   forming a patterned bottom metal layer, the bottom metal layer covering sidewalls of the groove;
   forming an organic interlayer on the bottom metal layer; and
   forming a top metal layer on the organic interlayer, wherein an edge of the bottom metal layer and an edge of the top metal layer enclose to enclose the organic interlayer, thereby forming at least one metal trace.

10. The method according to claim 9, wherein the base layer further comprises a flexible substrate, the flexible substrate extends from the bending area to the non-bending area, and the functional layer is disposed on the flexible substrate.

11. The method according to claim 9, wherein in the step of forming the hole on the functional layer, the hole passes through the functional layer and a surface of the flexible substrate is exposed, and in the step of filling the organic layer in the hole, the organic layer covers an exposed surface of the flexible substrate.

12. A display panel, comprising the flexible array substrate of claim 1 and a light-emitting layer disposed on the flexible array substrate, the light-emitting layer comprising an organic planarization layer, the organic planarization layer extends from the bending area to the non-bending area, and the organic planarization layer covers the functional layer, the metal trace, and the organic layer.

13. The display panel according to claim 12, wherein the light-emitting layer further comprises a pixel definition layer extending from the bending area to the non-bending area, the pixel defining layer covers the organic planarization layer in the bending area, and the pixel definition layer is patterned to form a plurality of light-emitting areas in the non-bending area.

* * * * *